US006842708B2

(12) United States Patent
Odaohhara

(10) Patent No.: US 6,842,708 B2
(45) Date of Patent: Jan. 11, 2005

(54) METHOD AND APPARATUS FOR DETERMINING BATTERY LIFE

(75) Inventor: Shigefumi Odaohhara, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 10/133,922

(22) Filed: Apr. 26, 2002

(65) Prior Publication Data

US 2002/0161537 A1 Oct. 31, 2002

(30) Foreign Application Priority Data

Apr. 27, 2001 (JP) ........................................ 2001-133510

(51) Int. Cl.$^7$ .............................................. G01R 31/36
(52) U.S. Cl. .......................................... 702/63; 702/57
(58) Field of Search ................................ 320/134, 162; 324/426, 427, 428, 429; 702/57, 63, 60; 73/861.78; 429/91; 455/572; 607/27, 29

(56) References Cited

U.S. PATENT DOCUMENTS

| 4,743,831 | A | * | 5/1988 | Young ........................ 320/127 |
| 5,565,759 | A | * | 10/1996 | Dunstan ...................... 320/135 |
| 5,751,217 | A | * | 5/1998 | Kchao et al. .......... 340/636.16 |
| 6,087,808 | A | * | 7/2000 | Pritchard ..................... 320/132 |
| 6,108,579 | A | * | 8/2000 | Snell et al. .................... 607/29 |
| 6,232,750 | B1 | * | 5/2001 | Podrazhansky et al. ...... 320/139 |
| 6,259,232 | B1 | * | 7/2001 | Douglass et al. ........... 320/133 |
| 6,448,743 | B2 | * | 9/2002 | Sano et al. .................. 320/162 |
| 6,538,449 | B2 | * | 3/2003 | Juncker et al. .............. 324/429 |
| 6,563,318 | B2 | * | 5/2003 | Kawakami et al. ......... 324/426 |
| 6,608,469 | B2 | * | 8/2003 | Fukuoka et al. ............. 320/134 |
| 6,642,719 | B1 | * | 11/2003 | Seto ............................ 324/427 |

FOREIGN PATENT DOCUMENTS

| EP | 0 507 570 | * | 10/1992 | ........... G01R/31/36 |
| JP | 05-074501 | * | 3/1993 | .......... H01M/10/48 |
| JP | 07-240235 | | 9/1995 | |
| JP | 10-214643 | | 8/1998 | |
| JP | 2000-012104 | * | 1/2000 | .......... H01M/10/48 |
| JP | 2000-067932 | | 3/2000 | |
| JP | 2000-116013 | | 4/2000 | |
| JP | 2000-121710 | | 4/2000 | |

OTHER PUBLICATIONS

JP9000466, Japanese Search Report.

* cited by examiner

Primary Examiner—John Barlow
(74) Attorney, Agent, or Firm—Scott W. Reid

(57) ABSTRACT

A method and apparatus in accordance with the present invention determines the life of a battery which is repeatedly charged and discharged while providing power to one or more electronic devices. The battery is provided with a circuit for measuring current while the battery is charged, another circuit for stopping the charging of the battery, a circuit for measuring the voltage of the battery while charged and while charging is stopped. A CPU is included for computing an internal impedance depending on the measured battery voltage, the current under charge and the battery voltage while charging is stopped. An embedded controller is also included for determining the life of the battery depending upon the information about the internal impedance calculated by the CPU. Finally, information about the battery life can be displayed or delivered to a user at a predetermined time or continuously during use.

7 Claims, 6 Drawing Sheets

OptionalMfgFunction2()... Code hex3e bit 12 - 0   : Measured impedence value: 0 to 8,192 mΩ  (every mΩ )

bit 15 - 13  :bit' 000' Normal state (Level in which battery can be used with no problem)

bit' 001' End of life (Close to replacement thing)

bit' 010' Expiry of life (State in which actual capacity of battery is considerably reduced)

bit' 100' Considerably exceeding life (Level at which operational trouble such as hibernation occurs)

*FIG. 3*

METHOD AND APPARATUS FOR DETERMINING BATTERY LIFE

BACKGROUND OF THE INVENTION

1. Technical Field

The present invention relates to a power supply system or the like provided with a battery (secondary battery) which can be used while repeatedly charging and discharging, and more particularly to a power supply system or the like for determining the life of the battery.

2. Background

Various electrical apparatuses such as, for example, information terminal units represented by notebook-type personal computers (notebook PCs), Mini Disk drives, and video cameras, mainly use a secondary battery as a type of a battery which can be used many times while repeatedly charging and discharging. The secondary battery is typically an inexpensive nickel-hydrogen battery or nickel-cadmium battery having a comparatively large capacity. Sometimes, a lithium-ion battery may be used, which has a high energy density per unit weight compared with a nickel-cadmium battery. Or, a lithium-polymer battery might be used, which uses a solid polymer instead of a liquid electrolyte.

In the case of a secondary battery represented by a nickel-hydrogen battery, nickel-cadmium battery, lithium-ion battery, and lithium-polymer battery, when the life of the battery expires, the operation time of the battery decreases. Therefore, users have a strong desire to know the life of the battery. However, users cannot easily know the life of a battery and therefore, a user may replace a battery with a new one when it is unnecessary to replace the battery.

Currently, one available method of knowing the life of a battery is that of controlling the number of charge and discharge cycles using an intelligent battery containing a microcomputer and determining the life in accordance with the number of cycles. However, the life of the battery fluctuates greatly depending on the operating environment (temperature environment, system load during operation, overcharge state, etc.). Therefore, it is impossible to determine the operating environment of a user by the above method and thus, the method is insufficient for determination of the life of a battery and the battery replacement timing is frequently sub-optimal.

Another method is available for actually charging and discharging a battery and determining the life of the battery in accordance with the capacity of the battery. According to this method, it is possible to almost accurately measure the life of a battery. However, the method requires approximately a half of a full day to know the life of one apparatus because the life of the apparatus is not known until it is charged and completely discharged. Therefore, this method requires an inordiante amount of time and effort. Moreover, in the case of these methods, including control of the number of charge and discharge cycles described above, though an expert can determine the life of a battery by analyzing the battery, it is difficult for a casual user to determine that the battery is near the end of its useful life.

For these reasons, and others readily identified by those skilled in the art, it would be desirable to provide an apparatus and method for determining the remaining useful life of a battery and for communicating such information to a user of the battery.

SUMMARY OF THE INVENTION

To attain the above objects, the present invention is characterized by accurately measuring the internal impedance of a battery and determining the life of the battery in accordance with the measured internal impedance. That is, the present invention contemplates an electrical apparatus having a body which consumes power and a battery for supplying power to the body by charge and discharge. The invention includes a current-value measurement means for measuring the current value at a constant current when charging or discharging the battery until a predetermined time passes after starting charge of the battery and a voltage measurement means for measuring the battery voltage at the constant current and for measuring a stop battery voltage serving as a battery voltage when the constant current is stopped. The present invention also includes internal impedance measurement means for measuring the internal impedance of the battery in accordance with the measured current value, battery voltage, and stop battery voltage. The method and apparatus of the present invention then determines the life of the battery in accordance with the measured internal impedance. Finally, an output mechanism is provided for delivering the information about the battery life to a user. In this case, the expression "constant current" does not restrictively indicate an absolutely constant current but a current within a predetermined range. For example, the constant current may reflect the fluctuation of a charge current that may generally occur or the level at which a constant current can be determined through sampling during a plurality of hours of actual use.

Moreover, the present invention is a computer apparatus having a battery pack for supplying power to the system body by repeating charge and discharge, in which the battery pack is provided with a voltage measurement circuit for measuring the battery voltage of its own and the battery voltage when charge is temporarily stopped, a current measurement circuit for measuring the charge current of its own and a CPU for computing an internal impedance in accordance with the measured battery voltage and charge current and the system body is provided with a controller for determining the life of the battery pack in accordance with the internal impedance computed by the CPU of the battery pack and a display for displaying a message about the determined life.

Furthermore, the present invention can be recognized as a battery-life determination system for determining the life of a battery for performing charge and discharge and supplying power to the body. The battery-life determination system is provided with internal impedance measurement means for measuring the internal impedance of the battery by measuring the battery voltage and current value of the battery at a constant current and the battery voltage when stopping supply of the current and determination means for determining the life of the battery in accordance with the measured internal impedance.

The battery constituting the system can he configured as a battery pack to be set to the body. In this case, when the internal impedance measurement means can be set in the battery pack, it is possible to determine the life of the battery in accordance with the information about the transmitted internal impedance without recognizing the type of the battery pack. Moreover, by constituting the internal impedance measurement means and determination means so that they are set to the body side, it is also possible to determine the life of a non-intelligent battery with no CPU or communication function with the body side. When many types of batteries may be used, it is more preferable that the type of a battery can be specified by recognizing the type of the battery in accordance with a predetermined resistance value.

From another point of view, a battery-life determination system of the present invention is characterized by including under-charge-battery-voltage measurement means for measuring the battery voltage while a secondary battery which is a repeatedly-usable battery while performing charge and discharge is charged, charge-current measurement means for measuring the charge current under charge, stop means for stopping charge under charge, under-stop-battery-voltage measurement means for measuring the under-stop battery voltage while charge of a secondary battery is stopped, internal impedance computation means for computing the internal impedance of the secondary battery in accordance with the under-charge battery voltage and charge current and the under-stop battery voltage, and life determination means for determining the life of a battery in accordance with the computed internal impedance.

Moreover, the present invention is a battery for supplying power to a body by repeating charge and discharge, characterized by including under-charge-voltage measurement means for measuring the battery voltage under charge, current measurement means for measuring a charge current value, charge stop means for temporarily stopping charge under constant-current charge, under-stop-voltage measurement means for measuring the battery voltage when charge is stopped, computation means for computing an internal impedance in accordance with the under-charge battery voltage, charge current value, and under-stop battery voltage, and transmission means for transmitting the information about the computed internal impedance to the body side.

Moreover, the present invention can be recognized as a battery-life detection method. Similarly in this case, the method is characterized by comprising the steps of measuring the battery voltage and charge current value under charge and the charge-stop battery voltage when charge is stopped, computing the internal impedance of a battery by dividing the difference ($\Delta V$) between the battery voltage and the charge-stop battery voltage by the charge current value, determining the life of the battery in accordance with the internal impedance, dividing life information into a plurality of stages, and selecting and message-outputting the life of the battery in accordance with the internal impedance.

From still another point of view, a battery-life detection method to which the present invention is applied measures the battery voltage and current value of a battery at constant current whose current value is stabilized while the battery is charged or discharged, measures a stop battery voltage by stopping supply of the constant current, computes the internal impedance of the battery in accordance with the measured stop battery voltage, and determines the life of the battery. For example, because a current value is stabilized under charge differently from under discharge and moreover, constant-current charge is performed within 1 hr after start of charge, it is preferable to measure an internal impedance at the constant current.

BRIEF DESCRIPTION OF THE DRAWINGS

Hereafter, the present invention will be described in detail in accordance with the embodiments shown in the accompanying drawings, in which:

FIG. 3 shows the value of the data OptionalMfgFunction2( ) to be transmitted from an intelligent battery to an embedded controller;

DETAILED DESCRIPTION OF THE PREFERRED EMBODIMENT(S)

Figure 1:
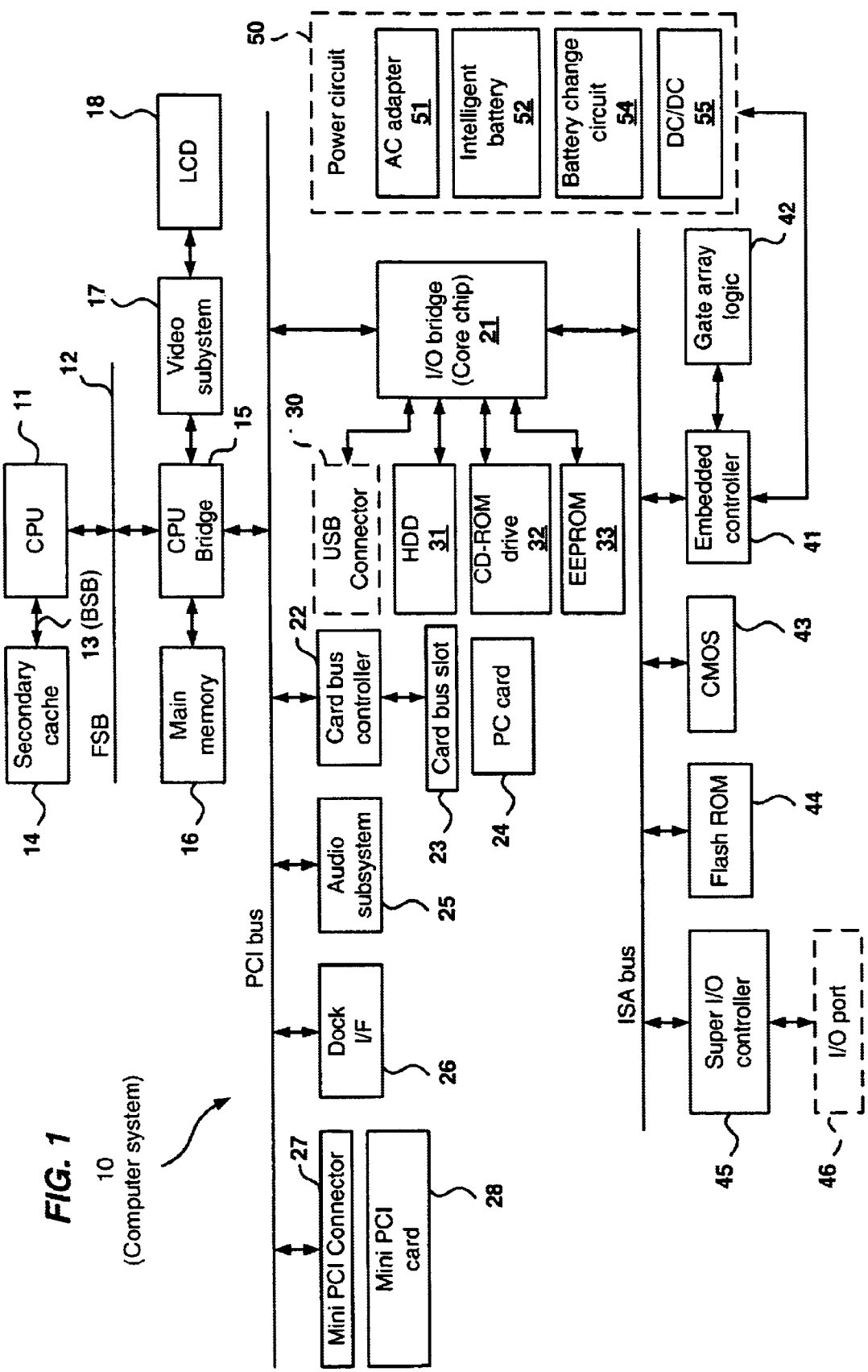
FIG. 1 shows an embodiment of the present invention in a hardware configuration of a computer system.

FIG. 1 shows a hardware configuration of a computer system 10 to which the embodiment 1 is applied. A computer apparatus provided with the computer system 10 conforms to, for example, the OADG (Open Architecture Developer's Group) specification and is configured as a notebook PC (notebook-type personal computer) having a predetermined OS (operating system).

In the case of the computer system 10 shown in FIG. 1, a CPU 11 functions as the head of the whole computer system 10 and executes various programs under the control by the OS. The CPU 11 is connected with components through three stages of buses such as an FSB (Front Side Bus) 12 serving as a system bus, a PCI (Peripheral Component Interconnect) bus 20 serving as a high-speed I/O-unit bus, and an ISA (Industry Standard Architecture) bus 40 serving as a low-speed I/O-unit bus. The CPU 11 accelerates processings by storing program codes and data in a cache memory. In recent years, an SRAM of approx. 128 KB is integrated in the CPU 11 as a primary cache. Moreover, to cover the capacity deficiency, a secondary cache 14 of approx. 512 KB to 2 MB is set through a BSB (Back Side Bus) 13 serving as a dedicated bus. Furthermore, it is possible to lower the cost by omitting the BSB 13, connecting the secondary cache 14 to the FSB 12, and thereby avoiding a package having a large number of terminals.

The FSB 12 and PCI bus 20 are connected each other by a CPU bridge (host-PCI bridge) 15 referred to as a memory/PCI chip. The CPU bridge 15 is configured by including a memory control function of controlling access operations to a main memory 16, and a data buffer for absorbing the difference of data transfer speed between the FSB 12 and PCI bus 20. The main memory 16 is a writable memory used as the read area of an execution program of the CPU 11 or a work area in which processing data of the execution program is written. For example, the main memory 16 is configured of a plurality of DRAM chips and, for example, comes with 64 MB, expandable to 320 MB. The execution program includes firmware such as various drivers for hardware-operating an OS and a peripheral unit, an application program for a specified business and a BIOS (Basic Input/Output System) stored in a flash ROM 44 to be mentioned later.

A video subsystem 17 is a subsystem for realizing functions relating to video and includes a video controller. The video controller processes a drawing command output from the CPU 11, writes the processed drawing information in a video memory and reads the drawing information from the video memory, and outputs the drawing information to a liquid-crystal display (LCD) 18 as drawing data.

The PCI bus 20 is a bus for realizing comparatively-high-speed data transfer, which is standardized by the specification in which a data-bus width is set to 32 or 64 bits, a maximum operation frequency is set to 33 or 66 MHz, and a maximum data transfer rate is set to 132 or 528 MB/sec. The PCI bus 20 connects with an I/O bridge 21, a card bus controller 22, an audio subsystem 25, a docking-station interface (Dock I/F) 26, and a mini PCI connector 27.

The card bus controller 22 is a dedicated controller for directly connecting a bus signal of the PCI bus 20 to the interface connector (card bus) of a card bus slot 23. It is possible to set a PC card 24 to the card bus slot 23. The docking-station interface 26 is hardware for connecting a docking station (not illustrated) serving as a feature expansion unit of the computer system 10. When a notebook PC is connected to the docking station, various hardware elements connected to the internal bus of the docking station are connected to the PCI bus 20 through the docking-station interface 26. Moreover, a mini PCI card 28 is connected to the mini PCI connector 27.

The I/O bridge 21 has a bridge function with the PCI bus 20 and ISA bus 40. Moreover, the I/O bridge 21 has a DMA controller function, a programmable interrupt controller (PIC) function, a programmable interval timer (PIT) function, an IDE (Integrated Device Electronics) interface function, a USA (Universal Serial Bus) function, and an SMB (System Management Bus) interface function and includes a real-time clock (RTC).

The DMA controller function is a function of executing data transfer between a peripheral unit such as an FDD and the main memory 16 without the CPU 11. The PIC function is a function of executing a predetermined program (interrupt handler) in response to an interrupt request (IRQ) output from a peripheral unit. The PIT function is a function of generating a timer signal at a predetermined cycle. Moreover, an interface realized by the IDE interface function connects with an IDE hard-disk drive (HDD) 31 and a CD-ROM drive 32 through an ATAPI (AT Attachment Packet Interface). It is permitted that the interface connects with other type of an IDE apparatus such as a DVD (Digital Versatile Disk) driver instead of the CD-ROM drive 32. External memories such as the HDD 31 and CD-ROM drive 32 are set in a setting place referred to as a "media bay" or "device bay" in a notebook PC body. These normally-set external memories may be set exchangeably with and exclusively against other unit such as an FDD or battery pack.

Moreover, the I/O bridge 21 is provided with a USB port and the USB port is connected with a USB connector 30 set to the wall face of, for example, a notebook PC. Moreover, the I/O bridge 21 connects with an EEPROM 33 through an SM bus. The EEPROM 33 is a nonvolatile memory for holding the information about a password, a supervisor password, and a product serial number entered by a user and its storage contents can be electrically rewritten.

Furthermore, the I/O bridge 21 is connected to a power circuit 50. The power circuit 50 is provided with an AC adapter 51 connected to a 100-V commercial power source to perform AC/DC conversion, an intelligent battery 52 serving as a battery (secondary battery), and circuits such as a battery change circuit 54 for charging the intelligent battery 52 and changing power supply routes from the AC adapter 51 and intelligent battery 52 and a DC/DC converter (DC/DC) 55 for generating DC constant voltages such as +15 V, +5 V, and +3.3 V used for the computer system 10.

Moreover, an internal register for controlling power-source states of the computer system 10 and a logic (state machine) for controlling power-source states of the computer system 10 including operations of the internal register are set in a core chip constituting the I/O bridge 21. The logic transmits/receives various signals to/from the power circuit 50 and recognizes an actual power supply state from the power circuit 50 to the computer system 10 through the transmission and reception of signals. The power circuit 50 controls power supply to the computer system 10 in accordance with a designation from the logic.

The ISA bus 40 is a bus having a data transfer rate (e.g. bus width of 16 bits and maximum data transfer rate of 4 MB/sec) lower than that of the PCI bus 20. The ISA bus 40 connects with an embedded controller 41 connected to a gate array logic 42, a CMOS 43, a flash ROM 44, and a super I/O controller 45. Moreover, the ISA bus 40 is used to connect peripheral units to be operated at a comparatively low speed such as a keyboard or mouse controller. The super I/O controller 45 connects with an I/O port 46 to drive an FDD and control input/output of parallel data (PIO) through a parallel port and input/output of serial data through a serial port (SIO).

The embedded controller 41 controls a not-illustrated keyboard and is connected to the power circuit 50 to bear a part of a power management function by a built-in power management controller (PMC) together with a gate array logic 42.

Figure 2:
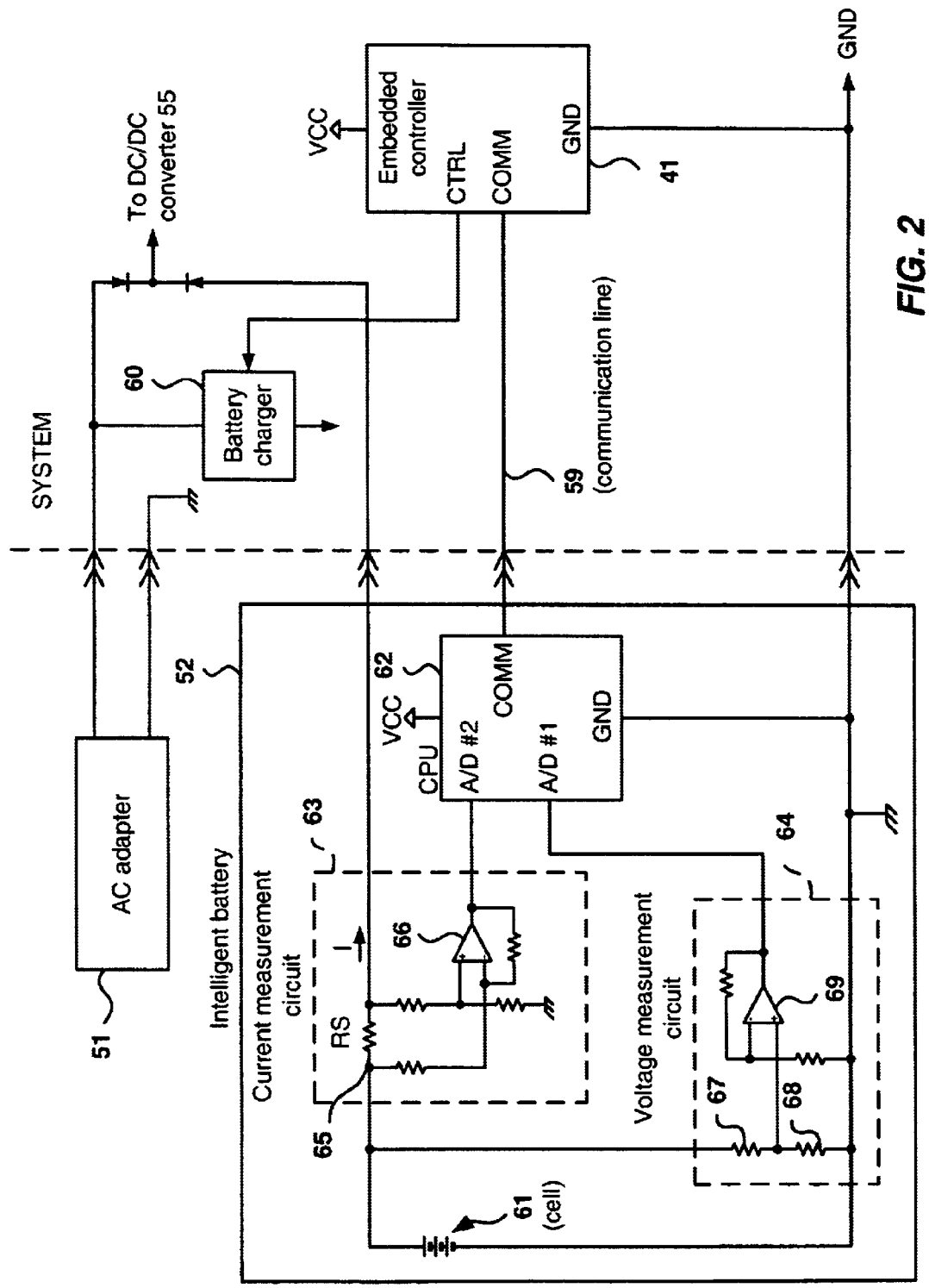
FIG. 2 shows a general configuration of the battery-life determination system of the embodiment depicted in FIG. 1.

FIG. 2 shows a general configuration of the battery-life determination system of this embodiment. The battery-life determination system shown in FIG. 2 includes an AC adapter 51 serving as a power supply unit connected to a commercial power source and an intelligent battery 52 which is a secondary battery constituted by a nickel-hydrogen battery used by repeating charge and discharge and conforms to an SBS (Smart Battery System). The power supplied from the AC adapter 51 and intelligent battery 52 is output to the DC/DC converter 55. Moreover, in FIG. 2, a battery charger 60 having a characteristic in which a current at a certain level or higher does not flow and the embedded controller 41 are shown at the body system side. Though the AC adapter 51 serving as a power supply unit is generally set to the outside of an electrical apparatus such as a notebook PC containing the computer system 10, it may be set in the housing of the apparatus. Moreover, the intelligent battery 52 is removable from the body system as a battery pack and it may be set in the housing of an electrical apparatus.

The intelligent battery 52 is provided with a cell 61 configured of a plurality of single cells, a CPU 62 for controlling the intelligent battery 52 and communicating with the embedded controller 41, a current measurement circuit 63 for measuring current values for charge and discharge of the intelligent battery 52, and a voltage measurement circuit 64 for measuring the voltage of the intelligent battery 52 as a battery to be charged and discharged. The CPU 62 set in the intelligent battery 52 converts an analog signal input from the current measurement circuit 63 or voltage measurement circuit 64 into a digital signal. Moreover, the CPU 62 can transmit the converted digital information to the embedded controller 41 as the system side through a communication line 59 serving as a communication path.

The intelligent battery 52 sets a maximum current value (e.g. 2,600 mA) to data ChargingCurrent( ) and supplies the set current value to the embedded controller 41 in order to prompt charge when the remaining power of the battery (cell 61) reduces to a certain value or less. When the embedded controller 41 receives ChargingCurrent( ) whose value is not equal to 0 mA, it turns on the battery charger 60 by using a CTRL signal. When the battery charger 60 is turned on, the intelligent battery 52 is charged by the power of the AC adapter 51. In this case, because the value of the ChargingCurrent( ) shows a maximum allowable charge current value, an actually-charged charge current value is not known. Therefore, the CPU 62 detects the charge current value by the current measurement circuit 63 in the intelligent battery 52. At the same time, the CPU 62 measures the battery voltage under charge by the voltage measurement circuit 64.

Because a current I flows through the current measurement circuit 63, a potential difference occurs in a resistance (Rs) 65. When assuming the voltage of the left terminal of the resistance (Rs) 65 as Vrs+ and the voltage of the right terminal of it as Vrs−, a value inversion-amplified by an operational amplifier 66 on the basis of Vrs− is input to the CPU 62. Moreover, in the case of the voltage measurement circuit 64, a voltage obtained by dividing a battery voltage by resistances 67 and 68 is input to one input of an operational amplifier 69, non-inversion-amplified by the operational amplifier 69, and output to the CPU 62.

Then, the intelligent battery 52 supplies ChargingCurrent( )=0 mA to the embedded controller 41 and stops charge. In this case, it is checked again by the current measurement circuit 63 whether current does not flow and the battery voltage when charge is stopped is measured by the voltage measurement circuit 64. According to the above operations, it is possible to obtain the internal impedance of a battery through the following expression.

Internal impedance of battery=(battery voltage when charge is performed−battery voltage when charge is not performed)/charge current value With regard to the relation between the measured internal impedance and the life of a battery, in the case of a nickel-hydrogen battery, as the remaining battery life is decreased, the measured internal impedance rises substantially linearly. In the case of the nickel-hydrogen battery, the internal impedance of the battery when shipped, is equal to approx. 20 mΩ per single cell of the cell 61 and it rises up to approx. 80 mΩ per single cell at the end of the life.

The CPU 62 of the intelligent battery 52 measures the internal impedance by the current measurement circuit 63 and voltage measurement circuit 64 and then, sets an effective value to ChargingCurrent( ) again, and sends it to the embedded controller 41. The embedded controller 41 turns on the battery charger 60 to restart charge and thereby, charge is continued until the capacity reaches 100%.

Thus, the internal impedance is computed in accordance with the battery voltage and charge current while charge is performed and the battery voltage when the charge is stopped. In this case, the charge current value is stabilized for a predetermined time after start of charge. When measurement is executed under the stable state, it is possible to obtain an almost-accurate internal impedance. Moreover, though a current value is not stable under discharge in general, there is no problem even under discharge when a stable state is obtained for a certain period. To know a stable state under discharge, there is a case in which current values sampled a predetermined number of times are kept within a predetermined threshold value. In this case, it is preferable to separately use a circuit (means) for determining that a constant current is used, current stop means for stopping supply of a discharge current only for a predetermined period (only a period necessary for computation), and measure an internal impedance in accordance with measured battery voltage and discharge current and under-stop battery voltage while discharge is temporarily stopped. The measurement under charge described for this embodiment is simple in circuit configuration and suitable for measurement of an internal impedance because there is no influence due to stop.

FIG. 3 shows the value of data OptionalMfgFunction2( ) transmitted from the intelligent battery 52 to the embedded controller 41. The above impedance value obtained by the CPU 62 is set to the OptionalMfgFunction2( ) and sent to the embedded controller 41. For example, bit 12 (bit12) up to bit 0 (bit0) of OptionalMfgFunction2( ) are measured impedance values which are transmitted from 0 mΩ up to 8,192 mΩ every mΩ. In the case of this embodiment, the state of a determined life is transmitted by using bit 15 (bit15) up to bit 13 (bit13).

For example, when bit 15 up to bit 13 are all set to 0 (bit '000'), this is assumed as a level at which a battery can be normally used with no problem. For example, in the case of bit '001', it is determined that the life of the battery almost expires and notification that the battery should be replaced is carried out. Moreover, for example, bit '010' shows a state in which the actual capacity of the battery considerably decreases because the life expires. Furthermore, bit '100' shows a level in which an operational trouble such as hibernation (function of storing operation contents in a hard disk and waiting) occurs because the battery considerably exceeds its life. In the case of a nickel-hydrogen battery, it is possible to determine that the battery is normal when the internal impedance per single cell is equal to or less than 59 mΩ, the battery is close to the end of the life when the impedance is kept between 60 and 79 mΩ, the life of the battery expires when the impedance is kept between 80 and 99 mΩ, and the battery is in a state considerably exceeding the life when the impedance is equal to or more than 100 mΩ.

The embedded controller 41 displays the measured impedance value received by OptionalMfgFunction2( ) on a utility program. Moreover, it is determined (bit '010') that the life of the battery expires, the controller 41 displays a message for urging a user to replace the battery with a new one by using, for example, the LCD 18. Moreover, it is possible to more minutely communicate the stepwise display corresponding to the level in FIG. 3 to a user according to necessity. Furthermore, as a rough display, there is a display method such as flickering of a battery mark.

In the case of the intelligent battery 52, it is possible to measure an impedance at the battery pack side and notify the system that the life of the battery expires (bit 15 to bit 13) using a communication function. The impedance for the life of a battery to expire depends on the type of a battery, the technology used for the battery, or the supply maker of a battery. In the case of this embodiment, it is unnecessary to identify and determine the type of a battery at the system side by determining the life in a battery and communicating the life to the system.

In the case of embodiment 1 of the present invention, as described above, the configuration for determining the life in a battery and communicating the life to the system is described by using the intelligent battery 52 using a nickel-hydrogen battery as an example. In the case of embodiment 2, a configuration for determining the life of an intelligent battery using a lithium ion battery and communicating the life to a user is described.

A configuration same as that of the embodiment 1 is described by using the same symbol but its detailed description is omitted.

Figure 4:
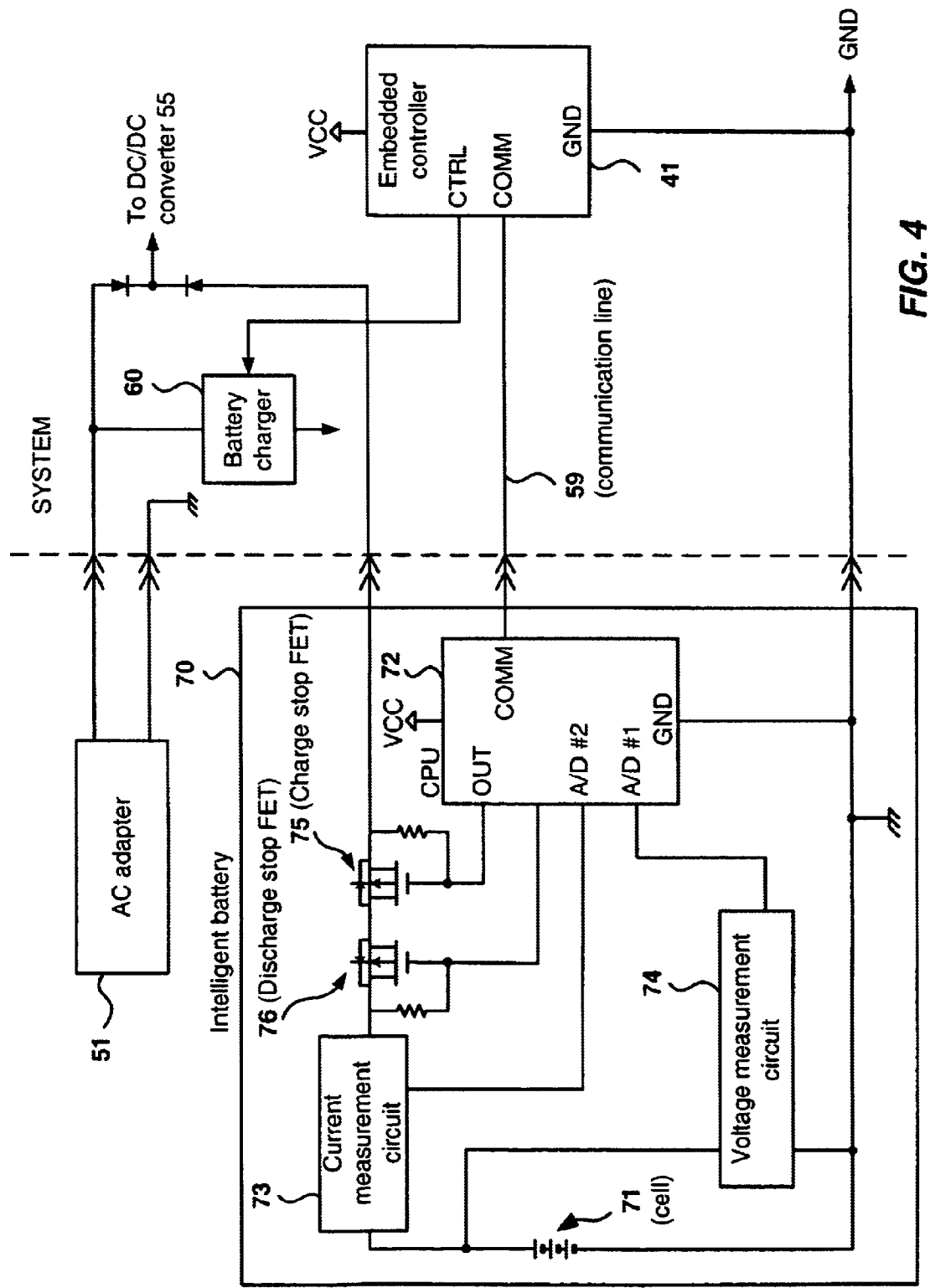
FIG. 4 shows a further embodiment of the present invention as a general configuration of a battery-life determination system.

FIG. 4 shows a general configuration of a battery-life determination system of the embodiment 2. The battery-life determination system shown in FIG. 4 includes an AC adapter 51 and a secondary intelligent battery 70 configured of a lithium ion battery conforming to an SBS. The power supplied from the AC adapter 51 and intelligent battery 70 is output to a DC/DC converter 55. Moreover, a battery charger 60 and an embedded controller 41 are shown as the body system side. The intelligent battery 70 is removable from the body system and it may be set in the housing of an electrical apparatus.

The intelligent battery 70 is provided with a cell 71 configured of a plurality of single cells, a CPU 72 for controlling the intelligent battery 70 and communicating with the embedded controller 41, a current measurement circuit 73 for measuring charge and discharge current values of the intelligent battery 70, and a voltage measurement circuit 74 for measuring the voltage of the intelligent battery 70 as a battery to be charged and discharged. Moreover, the battery 70 is provided with a charge stop FET 75 as a protective circuit when the battery charger 60 goes out of control and a discharge stop FET 76 as a protective circuit for preventing over-discharge of a battery. The CPU 72 is the same as the CPU 62 mounted on the intelligent battery 52 of the embodiment 1, which can communicate with the embedded controller 41 in the body system through a communication line 59 serving as a communication route. Moreover, the current measurement circuit 73 and voltage measurement circuit 74 are the same as the current measurement circuit 63 and voltage measurement circuit 64 described for the embodiment 1.

In the case of a lithium ion battery, the charge stop FET 75 and discharge stop FET 76 are generally used as protective circuits. In this case, when measuring the battery voltage when charge is stopped, it is unnecessary to set ChargingCurrent( )=0 mA and make the embedded controller 41 stop the battery charger 60 like the case of the nickel-hydrogen battery described for the embodiment 1. For example, while turning on the battery charger 60 at ChargingCurrent( )=2,600 mA, it is possible that the CPU 72 can control the charge stop FET 75 in the battery pack (intelligent battery 70), turn off the charge stop FET 75 to stop charge, and measure the battery voltage while charge is stopped by the voltage measurement circuit 74. Thus, it is unnecessary to make the embedded controller 41 turn off the battery charger 60 and turn it on again. It is possible to perform the control same as the case of the embodiment 1 except the control for stopping charge. Moreover, it is possible for the example shown for the embodiment 2 to perform the control same as the case of the embodiment 1.

In the case of a lithium ion battery, a charge system uses the constant-voltage-and-current system (CV+CC system). In this case, when the capacity of a battery becomes approx. 80% or more, constant-current charge changes to constant-voltage charge. Because a charge current decreases under constant-voltage charge, the current value is not kept constant. Therefore, it is preferable to measure an impedance under constant current charge in which a battery capacity is 80% or less in order to obtain a more accurate value.

Figure 5:
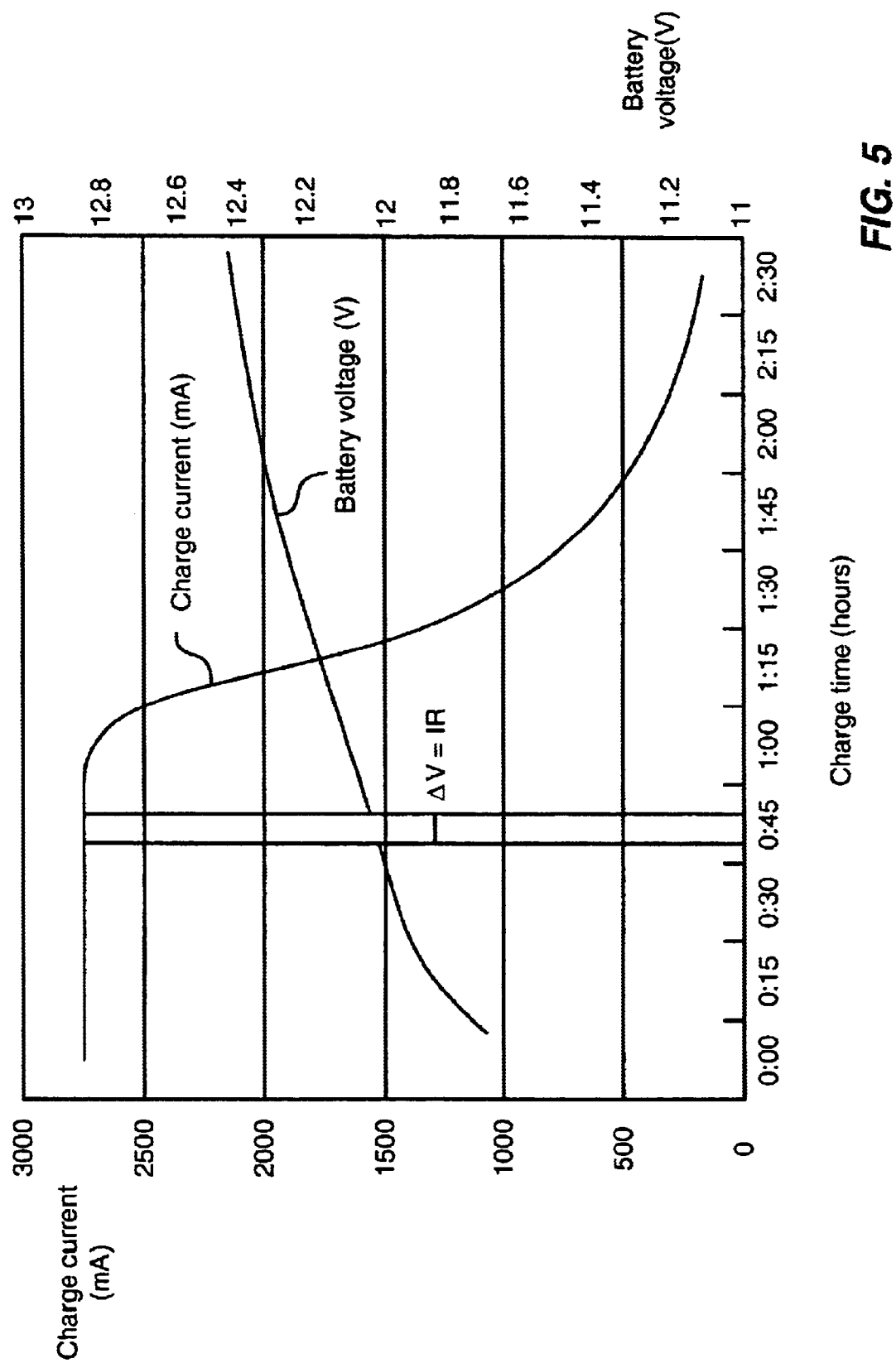
FIG. 5 shows operations while a lithium ion battery is charged.

FIG. 5 shows operations under charge when using a lithium ion battery. In FIG. 5, abscissa axis shows charge time (hours) and ordinate axis shows charge current (mA) and battery voltage (V). In FIG. 5, change states of values of charge current and battery voltage according to charge time are shown. It is assumed that an impedance is measured by stopping charge slightly after 0.4 hr passes. As shown in FIG. 5, when stopping charge, the battery voltage lowers by $\Delta V$. Because constant-current charge is continued for approx. 1 hr after start of charge, the charge current is constant. In this case, by assuming $\Delta V = IR$ and measuring $\Delta V$ and I, it is possible to accurately obtain a resistance R, that is, an impedance.

With regard to the relation between the measured internal impedance and the life of a battery, in the case of a lithium ion battery, the measured internal impedance of the battery when shipped is equal to approx. 60 m$\Omega$ per single cell, and the life of the battery expires, the internal impedance rises up to approx. 100 m$\Omega$ per single cell. A lithium ion battery has a characteristic that the impedance of the battery suddenly increases when the remaining life of the battery decreases. Though not clear as the case of the nickel-hydrogen battery shown for the embodiment 1, it is completely possible to determine a battery life in accordance with the rise of an internal impedance and recognize the timing for changing batteries. By applying the example of the state in FIG. 3 described for the embodiment 1 to a lithium ion battery, it is possible to determine that the battery is in the normal stage when the internal impedance is equal to 60 m$\Omega$, it reaches the end of the life when the impedance is equal to 70 $\Omega$, its life expires when the impedance is equal to 100 $\Omega$, and the battery is in the state considerably exceeding the life when the impedance is equal to 150 $\Omega$.

Thus, also in the case of the embodiment 2, it is possible to determine a battery life in accordance with almost accurate measurement of the internal impedance similarly to the case of the embodiment 1. For the embodiment 2, only a case of measuring an internal impedance under charge is described. However, it is also possible to measure an internal impedance under discharge. For example, the CPU 72 makes it possible to obtain the value of an internal impedance by determining the time of a constant current in which the current value is comparatively stable and temporarily stopping discharge by the discharge stop FET 76 to compute $\Delta V$. This method can be realized by stopping charge and discharge of a battery when connecting an AC adapter and then measuring voltage and current while forcibly supplying power from the battery to the body system.

For the embodiments 1 and 2 of the present invention, as described above, a method for realizing the embodiments 1 and 2 by the intelligent batteries 52 and 70 containing the CPUs 62 and 72 is described. For the embodiment 3, a case of applying the embodiment 3 to a non-intelligent battery having no microcomputer (CPU) is described.

A configuration used for the embodiments 1 and 2 is provided with the same symbol and its detailed description is omitted.

Figure 6:
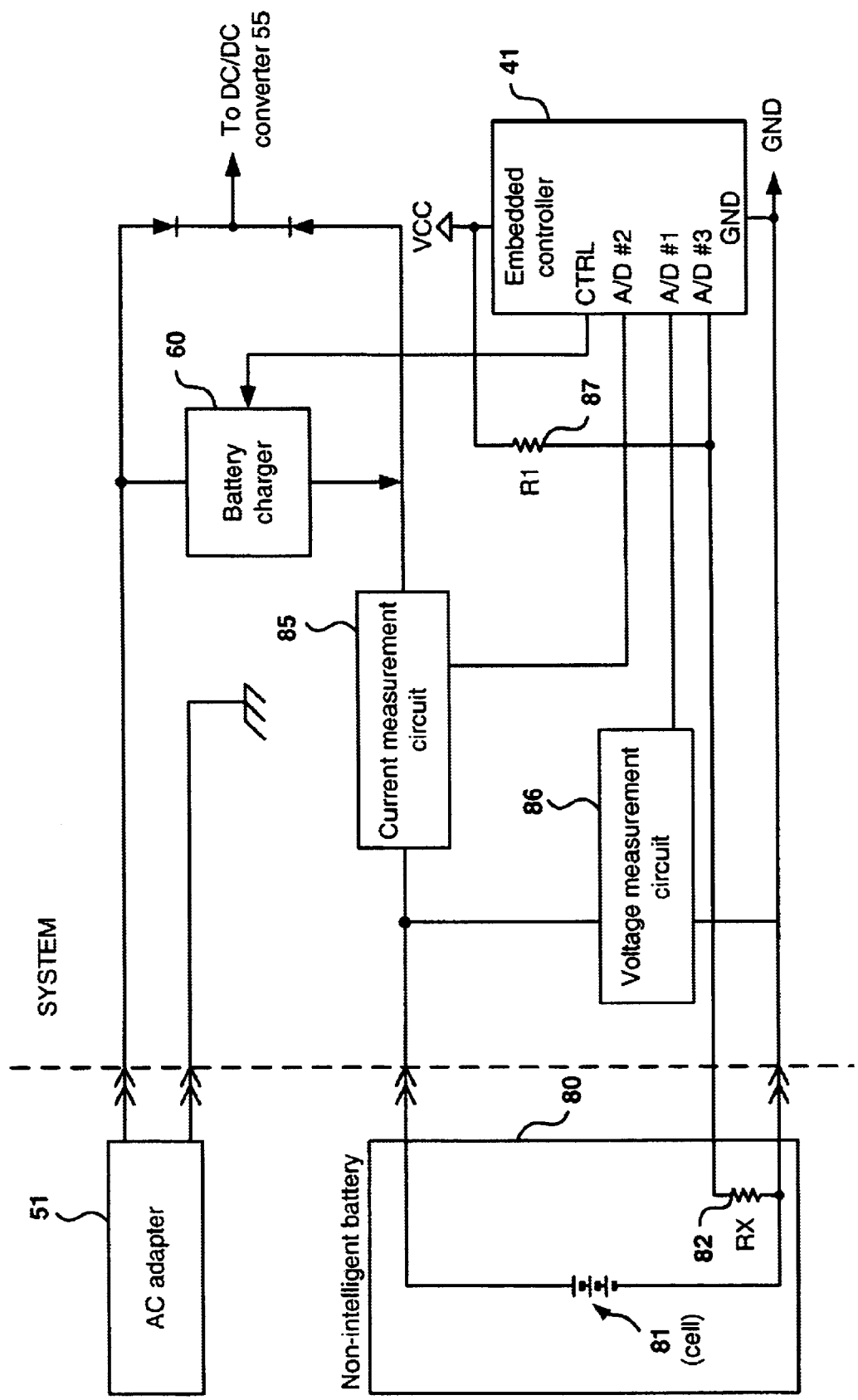
FIG. 6 shows still a further embodiment of a battery-life determination system of the present invention.

FIG. 6 shows a general configuration of the battery-life determination system of the embodiment 3. The battery-life determination system shown in FIG. 6 is provided with a non-intelligent battery 80 containing no CPU instead of the intelligent battery 52 or 70. Outputs from an AC adapter 51 and the non-intelligent battery 80 are supplied to a DC/DC converter 55. Moreover, the body system is provided with not only a battery charger 60 and an embedded controller 41 but also a current measurement circuit 85 for measuring the current value of the non-intelligent battery 80, a voltage measurement circuit 86 for measuring the voltage value of the non-intelligent battery 80, and a system resistance (R1) 87. The non-intelligent battery 80 has a cell 81 configured of a plurality of single cells and a resistance (RX) 82 having a value depending on the type of a battery as a resistance in a battery pack.

The current measurement circuit 85 and voltage measurement circuit 86 are circuits same as the current measurement circuits 63 and 73 and the voltage measurement circuits 64 and 74 set in the batteries (battery packs) shown for the embodiments 1 and 2, which directly output measured results to the embedded controller 41 which directly obtains the value of an impedance in accordance with these values. That is, data is directly obtained by setting the voltage measurement circuit 86 and current measurement circuit 85 in the system, inputting analog signals of the circuits 86 and 85 to the embedded controller 41, and converting the analog signals to digital signals in the controller 41. The embedded controller 41 controls the remaining power of the non-intelligent battery 80 through current integration (or battery voltage) and when the remaining power becomes a certain value or less, controls a CTRL signal and turns on the battery charger 60. The embedded controller 41 measures the battery voltage and charge current under charge by the voltage measurement circuit 86 and current measurement circuit 85. Then, the battery charger 60 is stopped to measure the battery voltage. It is possible to obtain the impedance of the non-intelligent battery 80 in accordance with the obtained data.

After the impedance of the non-intelligent battery 80 is computed, the battery charger 60 is turned on again to continue charge until the capacity reaches 100%. The type of the battery (non-intelligent battery 80) and an impedance table having a life corresponding to the type are stored in the internal memory of the embedded controller 41. Therefore, to determine the life of a battery, it is necessary that the battery is identified. In this case, the type of a battery is identified by changing values of the resistance (RX) 82 in a battery pack. It is possible to obtain the voltage {Vcc*RX/ (R1+RX)} input to the A/D #3 of the embedded controller 41 by the resistance (RX) 82 of the battery and the resistance (R1) 87 of the system. By converting the voltage input to the A/D #3 to digital data, the embedded controller 41 can detect (identify) which batter is connected and determine whether the life of the connected battery expires in accordance with the value of an impedance.

As described above, even in the case of the non-intelligent battery 80 having no CPU in a battery pack, it is possible to measure an internal impedance and determine the life of the battery. Though measurement under charge is described above as an example, measurement can be also performed even under discharge if the time of a constant current is considered similarly to the case of the embodiments 1 and 2. In this case, when using means for temporarily stopping discharge and it is possible to determine a constant current in accordance with a certain condition by the embedded controller 41, it is preferable to measure an internal impedance by using the means for temporarily stopping discharge to stop discharge. Moreover, to determine the type of a battery, it is possible to use a configuration through which a user can input the type of a battery.

As described above, according to the battery-life determination systems described for the embodiments 1 to 3, it is possible to determine the life of a battery in accordance with the value of the internal impedance of a battery by measuring the impedance. In this case, it is desired to almost accurately measure the impedance of the battery. However, when the system body is operated by a battery (under discharge), the discharge current is greatly fluctuated depending on the state of a currently-working program, a connected USB unit, or a PC card. Therefore, it is not preferable to accurately measure an impedance while a battery is discharged. However, when the AC adapter 51 is connected, it is most preferable to measure the impedance of a battery under charge because the AC adapter 51 supplies power to the system body and constant-current charge is basically performed to charge the battery.

According to the principal configuration of these embodiments, the battery voltage and current value at a constant current are measured, the current is stopped for a certain period, and then the battery voltage is measured again. Thereby, when the impedance of the battery is measured, usual charge is restarted to charge the battery up to 100%. Then, an internal impedance is computed in accordance with the batter-voltage difference ΔV and the current value. When the computed internal impedance becomes larger than a specified value, it is possible to notify a user that the timing for replacing the battery with a new one comes. Even if the measurement sequence is reversed, it is possible to compute the impedance. Therefore, it is also permitted to follow the sequence of measuring the voltage while supply of current is stopped and then measuring the voltage and current at a constant current. By using the above configuration, it is possible to immediately determine whether the life of a battery expires. Therefore, it is possible to eliminate unnecessary battery replacement.

As described above, the present invention makes it possible to accurately determine the life of a battery in an apparatus provided with the battery. As readily recognized by those skilled in the art, many of the exact details of the invention as described above may be varied without departing from the scope of the invention. In the drawings and specification above there have been set forth several preferred embodiments of the present invention, and, although specific terms are used, the description thus given uses terminology in a generic and descriptive sense only and not for purposes of limitation.

What is claimed is:

1. A battery-life detection method for detecting a life of a battery for performing charge and discharge and supplying power to a body, comprising the steps of:

measuring the voltage of the battery at a constant current whose value is stabilized while the battery is charged or discharged;

measuring the current value of the battery at the constant current;

stopping supply of current at the constant current;

measuring the stop battery voltage that is the voltage of the battery when supply of the current is stopped;

computing the internal impedance of a battery in accordance with the battery voltage, the current value, and the stop battery voltage; and determining the life of a battery in accordance with the internal impedance.

2. A computer apparatus having a battery pack which repeatedly charges and discharges to supply power from the battery pack to a system body, wherein the battery pack comprises:

a voltage measurement circuit for measuring a battery voltage when charging is, performed and when charging is stopped;

a current measurement circuit for measuring a charge current;

and a CPU for computing an internal impedance in accordance with the measured battery voltage and charge current, and wherein the system body comprises:

a controller for determining a life of the battery pack in accordance with the internal impedance computed by the CPU of the battery pack;

wherein the controller of the system body temporarily stops the charge of the battery pack when charging the battery pack at a constant current and determines the life of the battery pack in accordance with the internal impedance computed in accordance with the battery voltage when the charge is temporarily stopped and a display for displaying a message about the determined life.

3. A battery-life determination system for determining the life of a secondary battery for supplying power to a body, the system comprising:

an under-charge-battery-voltage measurement unit for measuring the battery voltage while the secondary battery is charged;

a charge current measurement unit for measuring the charge current while the secondary battery is charged;

a stop unit for stopping charge of the secondary battery while the secondary battery is charged;

an under-stop-bettery-voltage measurement unit for measuring the under-stop battery voltage of the secondary battery while charge of the secondary battery is stopped by the stop unit;

an internal impedance computation unit for computing the internal impedance of the secondary battery in accordance with the battery voltage and charge current under the charge and the under-stop battery voltage; and a life determination unit for determining the life of a battery in accordance with the internal impedance computed by the internal impedance computation unit.

4. The battery-life determination system according to claim 3, wherein the stop unit stops charge under constant-current charge when the value of charge current to the secondary battery is stabilized.

5. A battery for supplying power to a body by repeating charge and discharge, comprising:

an under-charge-voltage measurement unit for measuring the battery voltage under charge;

a current measurement unit for measuring the charge-current value under charge;

an under-stop-voltage measurement unit for measuring the battery voltage when charge is stopped; and a computation unit for computing an internal impedance in accordance with the battery voltage measured by the under-charge-voltage measurement unit, the charge current value measured by the current measurement unit, and the battery voltage measured by the under-stop-voltage measurement unit.

6. The battery according to claim 5, further comprising a transmission unit for transmitting the information about the internal impedance computed by the computation unit to the body.

7. The battery according to claim 5, further comprising a charge stop unit for temporarily stopping charge under the constant-current charge.

* * * * *